(12) United States Patent
Ok et al.

(10) Patent No.: US 10,672,643 B2
(45) Date of Patent: Jun. 2, 2020

(54) REDUCING OFF-STATE LEAKAGE CURRENT IN SI/SIGE DUAL CHANNEL CMOS

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US); Seyoung Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/109,512

(22) Filed: Aug. 22, 2018

(65) Prior Publication Data

US 2020/0066600 A1 Feb. 27, 2020

(51) Int. Cl.
*H01L 21/76* (2006.01)
*H01L 21/8238* (2006.01)
(Continued)

(52) U.S. Cl.
CPC ........ *H01L 21/76* (2013.01); *H01L 21/31053* (2013.01); *H01L 21/762* (2013.01);
(Continued)

(58) Field of Classification Search
CPC ..... H01L 21/823821; H01L 21/823828; H01L 21/823842; H01L 21/823857; H01L 21/823878; H01L 27/0924; H01L 29/66545; H01L 21/76; H01L 29/0607; H01L 29/0642; H01L 21/02107;
(Continued)

(56) References Cited

U.S. PATENT DOCUMENTS 7,510,932 B2  3/2009 Oh et al.
9,184,291 B2 11/2015 Yu et al.
(Continued)

FOREIGN PATENT DOCUMENTS

WO  WO2016209219 A1  12/2016

OTHER PUBLICATIONS

J.L. Gavartin et al., "The role of nitrogen-related defects in high-k dielectric oxides: Density-functional studies," Journal of Applied Physics 97, 053704 (Feb. 2005) (15 total pages).
(Continued)

*Primary Examiner* — Feifei Yeung Lopez
(74) *Attorney, Agent, or Firm* — Vazken Alexanian; Michael J. Chang, LLC

(57) ABSTRACT

Techniques for reducing off-state current in dual channel CMOS devices are provided. In one aspect, a method for forming a dual channel finFET includes: patterning NFET/PFET fins on a wafer from a first channel material and a second Ge-containing channel material; depositing a GeO$_2$ layer on the fins; annealing the fins to selectively oxidize the at least one PFET fin; depositing a liner onto the fins which induces a negative charge in the PFET fin(s); removing unreacted GeO$_2$ and the liner from the NFET fin(s); depositing a dielectric layer onto the fins which induces a positive charge in the NFET fin(s). A dual channel finFET device is also provided.

20 Claims, 10 Drawing Sheets

(51) Int. Cl.
*H01L 29/66* (2006.01)
*H01L 27/092* (2006.01)
*H01L 21/762* (2006.01)
*H01L 21/3105* (2006.01)
*H01L 21/768* (2006.01)
*H01L 29/06* (2006.01)

(52) U.S. Cl.
CPC .. *H01L 21/76829* (2013.01); *H01L 21/76832* (2013.01); *H01L 21/823807* (2013.01); *H01L 21/823821* (2013.01); *H01L 21/823828* (2013.01); *H01L 21/823842* (2013.01); *H01L 21/823857* (2013.01); *H01L 21/823878* (2013.01); *H01L 27/0924* (2013.01); *H01L 29/0607* (2013.01); *H01L 29/0642* (2013.01); *H01L 29/66545* (2013.01)

(58) Field of Classification Search
CPC ....... H01L 21/823481; H01L 21/76829; H01L 21/76832; H01L 21/31053; H01L 21/762
See application file for complete search history.

(56) References Cited

U.S. PATENT DOCUMENTS

| | | |
|---|---|---|
| 9,184,293 B2 | 11/2015 | Kim et al. |
| 9,362,308 B2 | 6/2016 | Nagumo |
| 9,543,215 B2 | 1/2017 | Lim et al. |
| 9,799,654 B2 | 10/2017 | Ok et al. |
| 2015/0028426 A1* | 1/2015 | Ching ............... H01L 29/785 257/401 |
| 2016/0372470 A1* | 12/2016 | Ok ............... H01L 21/823828 |
| 2017/0053835 A1 | 2/2017 | Sung et al. |

OTHER PUBLICATIONS

Koji Kita et al., "Intrinsic origin of electric dipoles formed at high-k/SiO2 interface," 2008 IEEE International Electron Devices Meeting, pp. 29-32 (Dec. 2008).
Yoshiki Yamamoto, et al., "Study of La-Induced Flat Band Voltage Shift in Metal/HfLaOx/SiO2/Si Capacitors," Japanese Journal of Applied Physics, vol. 46, No. 11, Nov. 2007, Abstract (1 page).

* cited by examiner $$Si + Ge + 2GeO_2 \longrightarrow Ge + 2GeO + SiO_2$$

REDUCING OFF-STATE LEAKAGE CURRENT IN SI/SIGE DUAL CHANNEL CMOS

FIELD OF THE INVENTION

The present invention relates to dual channel complementary metal-oxide semiconductor (CMOS) devices such as fin field-effect transistor (finFET) devices, and more particularly, to techniques for reducing source-drain off-state leakage current in dual channel CMOS devices via dipole formation using a maskless process.

BACKGROUND OF THE INVENTION

A fin field-effect transistor (finFET) device includes a fin channel interconnecting a source and a drain. A gate over the fin regulates current flow through the channel. It is oftentimes desirable to employ different channel materials for n-channel finFET (NFET) and p-channel finFET (PFET) devices, such as silicon (Si) and silicon germanium (SiGe), respectively.

Isolation between adjacent devices is typically achieved using shallow trench isolation (STI) whereby an insulator such as an STI oxide is deposited into trenches between the fins. However, forming STI regions with an STI oxide on SiGe fins undesirably results in significant SiGe fin loss due to oxidation during the STI thermal anneal.

To prevent fin loss, a nitride liner can be placed on the fins prior to depositing the STI oxide. With that configuration, however, significant source-drain off state leakage current is experienced in the NFET devices.

It has been found that forming a dipole layer at the fin/STI interface reduces source-drain off state leakage current. See, e.g., U.S. Pat. No. 9,799,654 issued to Ok et al., entitled "FET Trench Dipole Formation" (hereinafter "U.S. Pat. No. 9,799,654"), the contents of which are incorporated by reference as if fully set forth herein. However, implementing the techniques described in U.S. Pat. No. 9,799,654 requires masking steps to enable selective processing of NFET and PFET devices, which increases production complexity, time and overall costs.

Accordingly, improved techniques for reducing off-state current in dual channel CMOS devices via dipole formation and a maskless process would be desirable.

SUMMARY OF THE INVENTION

The present invention provides techniques for reducing off-state current in dual channel complementary metal-oxide semiconductor (CMOS) devices. In one aspect of the invention, a method for forming a dual channel fin field-effect transistor (finFET) device is provided. The method includes: patterning fins on a wafer, wherein the fins include at least one n-channel FET (NFET) fin formed from a first channel material and at least one p-channel FET (PFET) fin formed from a second channel material including germanium (Ge), and wherein the first channel material and the second channel material are dual channels of the finFET device; depositing a germanium oxide ($GeO_2$) layer on the fins; annealing the fins to selectively oxidize the at least one PFET fin based on a reaction of the $GeO_2$ layer with the second channel material thereby forming a first oxide layer on the at least one PFET fin while unreacted $GeO_2$ remains on the at least one NFET fin; depositing a liner onto the fins, wherein the liner has a positive polarity which induces a negative charge in the at least one PFET fin; removing the unreacted $GeO_2$ along with the liner from the at least one NFET fin; forming a second oxide layer on the at least one NFET fin; and depositing a dielectric layer onto the fins, wherein the dielectric layer has a negative polarity which induces a positive charge in the at least one NFET fin.

In another aspect of the invention, another method for forming a dual channel finFET device is provided. The method includes: patterning fins on a wafer, wherein the fins include at least one NFET fin formed from a first channel material and at least one PFET fin formed from a second channel material including Ge, and wherein the first channel material and the second channel material are dual channels of the finFET device; depositing a $GeO_2$ layer on the fins; annealing the fins to selectively oxidize the at least one PFET fin based on a reaction of the $GeO_2$ layer with the second channel material thereby forming a first oxide layer on the at least one PFET fin while unreacted $GeO_2$ remains on the at least one NFET fin; depositing a liner onto the fins, wherein the liner has a positive polarity which induces a negative charge in the at least one PFET fin; removing the unreacted $GeO_2$ along with the liner from the at least one NFET fin; forming a second oxide layer on the at least one NFET fin; depositing a dielectric layer onto the fins, wherein the dielectric layer has a negative polarity which induces a positive charge in the at least one NFET fin; forming dummy gates over the at least one NFET fin and over the at least one PFET fin; forming the gate spacers alongside the dummy gates; forming the source and drains on opposite sides of the dummy gates, offset from the dummy gates by the gate spacers; surrounding the dummy gates with a dielectric fill material; removing the dummy gates forming gate trenches over of the at least one NFET fin and over the at least one PFET fin; and forming replacement gates in the gate trenches.

In yet another aspect of the invention, a dual channel finFET device is provided. The dual channel finFET device includes: fins patterned on a wafer, wherein the fins include at least one NFET fin formed from a first channel material and at least one PFET fin formed from a second channel material including Ge, and wherein the first channel material and the second channel material include dual channels of the finFET device; a first oxide layer on the at least one PFET fin; a liner disposed on the PFET fins, wherein the liner has a positive polarity which induces a negative charge in the at least one PFET fin, and wherein the liner includes SiN, TiN, TaN and combinations thereof; a second oxide layer on the at least one NFET fin; a dielectric layer disposed on the fins, wherein the dielectric layer has a negative polarity which induces a positive charge in the at least one NFET fin, and wherein dielectric layer includes $Al_2O_3$, $TiO_2$, $ZrO_2$, $HfO_2$, MgO and combinations thereof; gates disposed over the fins; and source and drains formed on opposite sides of the gates, offset from the gates by gate spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing source-drain off state leakage current in dual channel (i.e., silicon Si/silicon germanium (SiGe)) complementary metal-oxide semiconductor (CMOS) devices such as fin field-effect transistor (finFET) devices via dipole formation. In FinFET devices, there is a current path at the bottom portion of the fin, which is not controlled by gate. When a drain bias is applied, current starts to flow without gate permission. This current path is what is being referred to herein as "source-drain off state leakage current." Advantageously, as will be described in detail below, the present techniques involve a maskless process whereby selective oxidation of Si in the SiGe fins by germanium dioxide ($GeO_2$) is used to form an oxide layer on the SiGe fins, followed by a lift-off of unreacted $GeO_2$ from the Si fins. With a maskless process, production complexity, time and overall production costs are desirably reduced.

Figure 1:
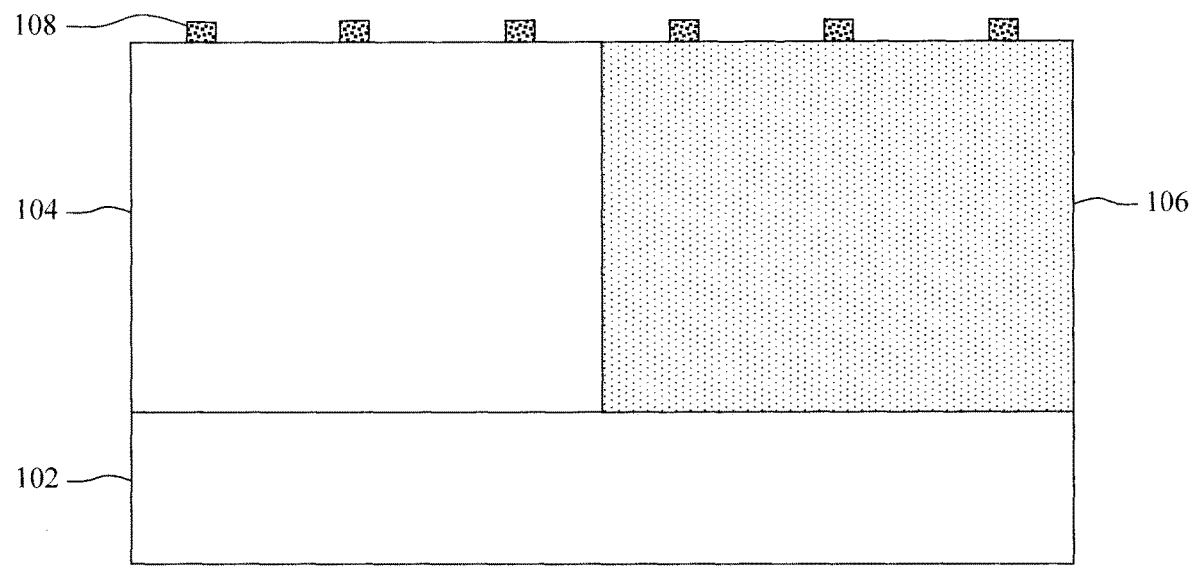
FIG. 1 is a cross-sectional diagram illustrating a first channel material layer having been formed on a (first) portion of a wafer, a second channel material layer having been formed on a (second) portion of the wafer, and fin hardmasks having been formed on the first/second channel material layers according to an embodiment of the present invention.

An exemplary methodology for forming a dual channel CMOS finFET device in accordance with an exemplary embodiment of the present techniques is now described by way of reference to FIGS. 1-17. As shown in FIG. 1, the process begins with a wafer 102.

According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. According to an exemplary embodiment, the wafer 102 includes a dielectric layer on which the first/second channel material layers 104/106 are formed (see below). Suitable dielectrics include, but are not limited to, oxide materials such as silicon dioxide ($SiO_2$).

A first channel material layer 104 is formed on a (first) portion of the wafer 102. By way of example only, an epitaxial process can be employed to grow a first channel material on the wafer 102. According to an exemplary embodiment, the first channel material is epitaxial Si. N-type dopants can be introduced during growth of the first channel material layer 104 (i.e., in-situ) or after growth (i.e., ex-situ) for example via ion implantation. Suitable n-type dopants include, but are not limited to, phosphorous (P), arsenic (As) and/or antimony (Sb).

A second channel material layer 106 is formed on another (second) portion of the wafer 102. Again, an epitaxial process can be employed to grow a second channel material on the wafer 102. According to an exemplary embodiment, the second channel material is epitaxial SiGe. By way of example only, the epitaxial SiGe contains from about 20% atomic weight Ge (SiGe25%) to about 25% atomic weight Ge (SiGe20%) and ranges therebetween. P-type dopants can be introduced during growth of the second channel material layer 106 (i.e., in-situ) or after growth (i.e., ex-situ) for example via ion implantation. Suitable p-type dopants include, but are not limited to, boron (B).

NFET and PFET fins are then patterned in the first/second channel material layers 104/106, respectively. To do so, standard lithography and etching techniques are employed to first form a plurality of individual fin hardmasks 108 on the first/second channel material layers 104/106. See FIG. 1. The fin hardmasks 108 mark the footprint and location of the NFET and PFET fins. Suitable fin hardmask materials include, but are not limited to, nitride hardmask materials such as silicon nitride (SiN).

Figure 2:
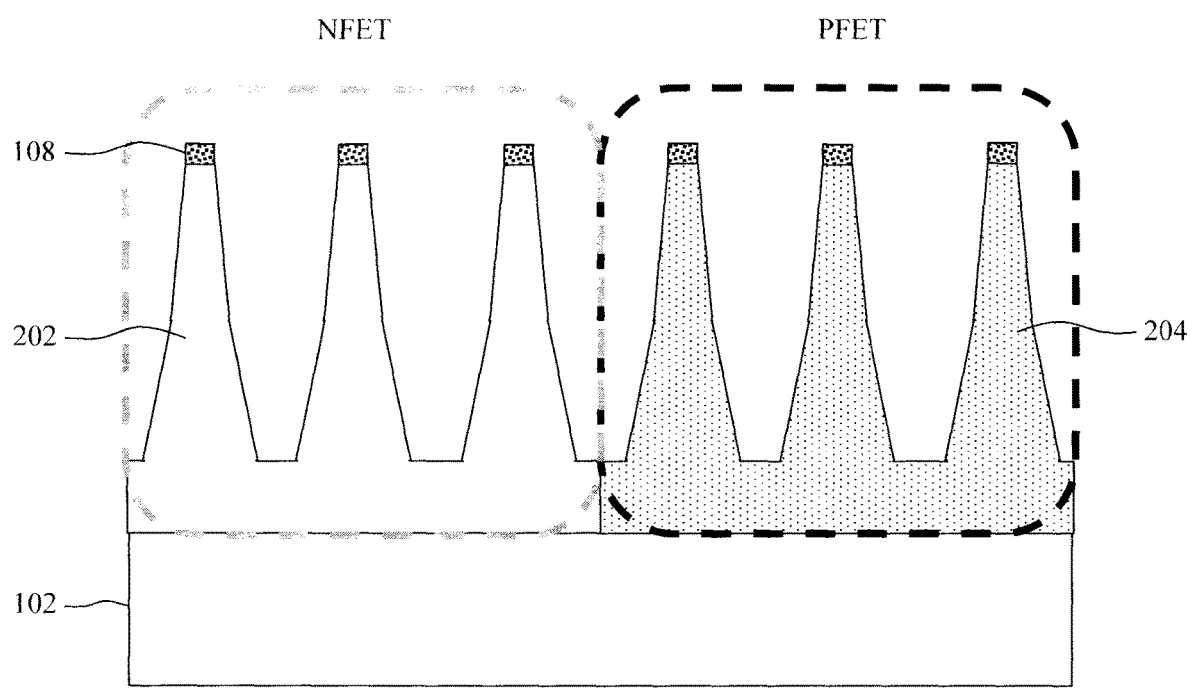
FIG. 2 is a cross-sectional diagram illustrating the fin hardmasks having been used to pattern at least one NFET fin and at least one PFET fin in the first/second channel material layers according to an embodiment of the present invention.

Next, as shown in FIG. 2, the fin hardmasks 108 are used to pattern at least one NFET fin 202 and at least one PFET fin 204 in the first/second channel material layers 104/106, respectively. According to an exemplary embodiment, a directional (i.e., anisotropic) etching process such as reactive ion etching (RIE) is used for the fin etch. As shown in FIG. 2, the NFET/PFET fins 202/204 as patterned can have sloped sidewalls giving the fins a triangular cross-sectional shape. However, other fin shapes are contemplated herein including, but not limited to, fins having perfectly vertical sidewalls and/or fins having curved sidewalls.

Figure 2A:
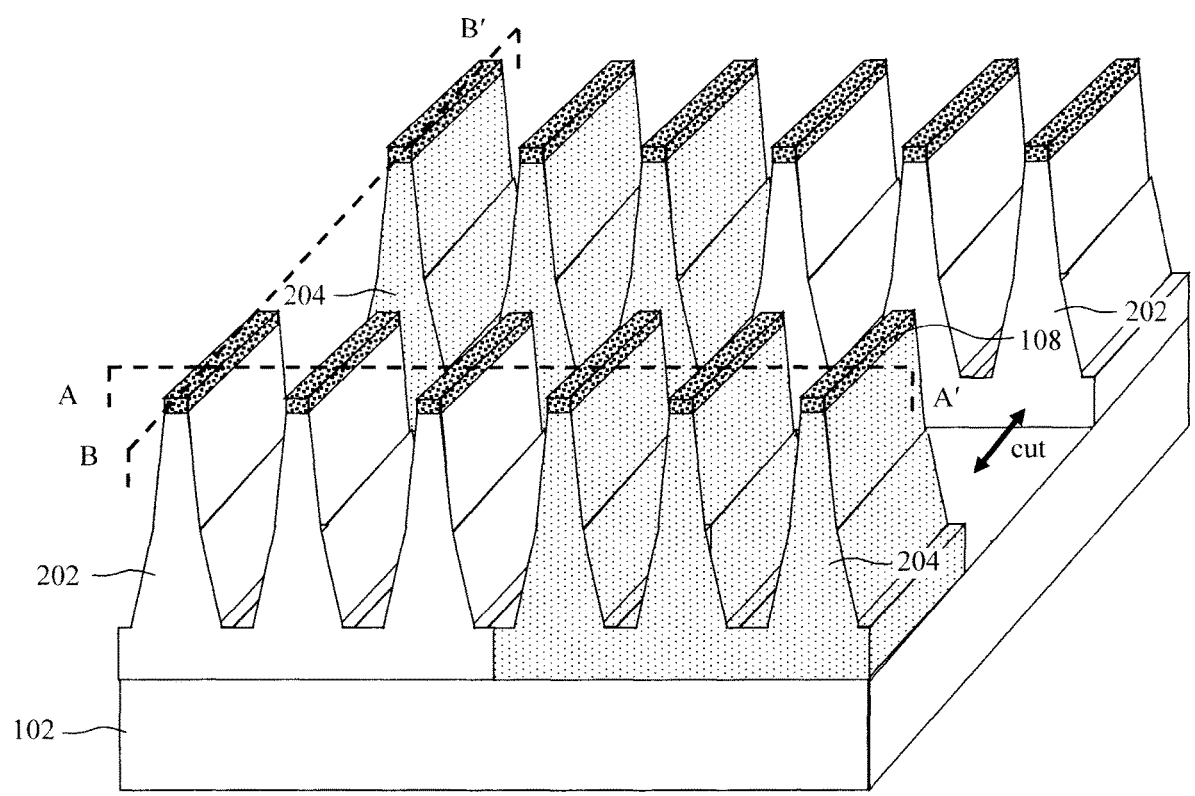
FIG. 2A is a three-dimensional diagram illustrating the patterned NFET and PFET fins according to an embodiment of the present invention.

A three-dimensional view of the patterned NFET and PFET fins 202 and 204 is shown in FIG. 2A. According to an exemplary embodiment, a sea of fins is first patterned, and then cut into the individual fins 202 and 204 shown in FIG. 2A. FIG. 2A further illustrates how, according to one embodiment, the fins 202/204 are configured on the substrate 102 with one type of fin (NFET fin 202 or PFET fin 204). Thus, for instance, when NFET fins 202 and PFET fins 204 are Si and SiGe, respectively, from left to right there are Si NFET fins 202 in front of SiGe PFET fins 204. The next group of fins to the right have the opposite orientation, i.e., SiGe PFET fins 204 in front of Si NFET fins 202, in order to provide a dual channel for adjacent devices.

The following description will reference various cross-sectional views of cuts through the device structure as shown in FIG. 2A. For instance, a cross-sectional view A-A' depicts a cut perpendicular to the fins 202/204, through adjacent fins 202/204, whereas a cross-sectional view B-B' depicts a cut parallel to the fins 202/204, though fins 202/204 arranged lengthwise in front of or behind the other.

A conformal layer 302 of germanium oxide (GeO$_2$) is then deposited onto the NFET/PFET fins 202/204. See FIG. 3. By way of example only, GeO$_2$ layer 302 is deposited onto the fins 202/204 using a process such as physical vapor deposition (PVD), chemical vapor deposition (CVD) or atomic layer deposition (ALD). According to an exemplary embodiment, GeO$_2$ layer 302 has a thickness of from about 2 nanometers (nm) to about 10 nm and ranges therebetween, e.g., about 3 nm.

Figure 3:
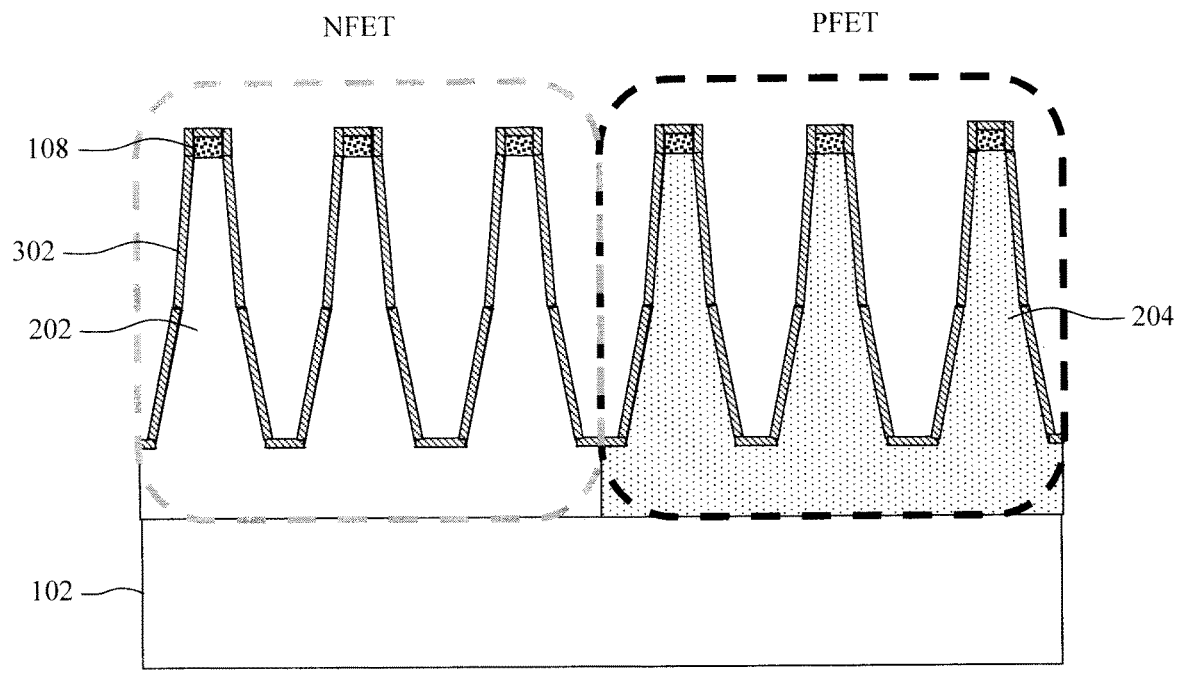
FIG. 3 is a cross-sectional diagram illustrating a conformal layer of $GeO_2$ having been deposited onto the NFET/PFET fins according to an embodiment of the present invention.

As shown in FIG. 3, CieO$_2$ layer 302 is present over both the NFET and PFET fins 202 and 204. However, as will be described in detail below, the oxidation reaction will occur only in the (e.g., SiGe) PFET fins 204. The GeO$_2$ layer 302 on the NFET fins 202 will remain unreacted and will be removed (from the NFET fins 202) using a lift-off process.

Figure 4:
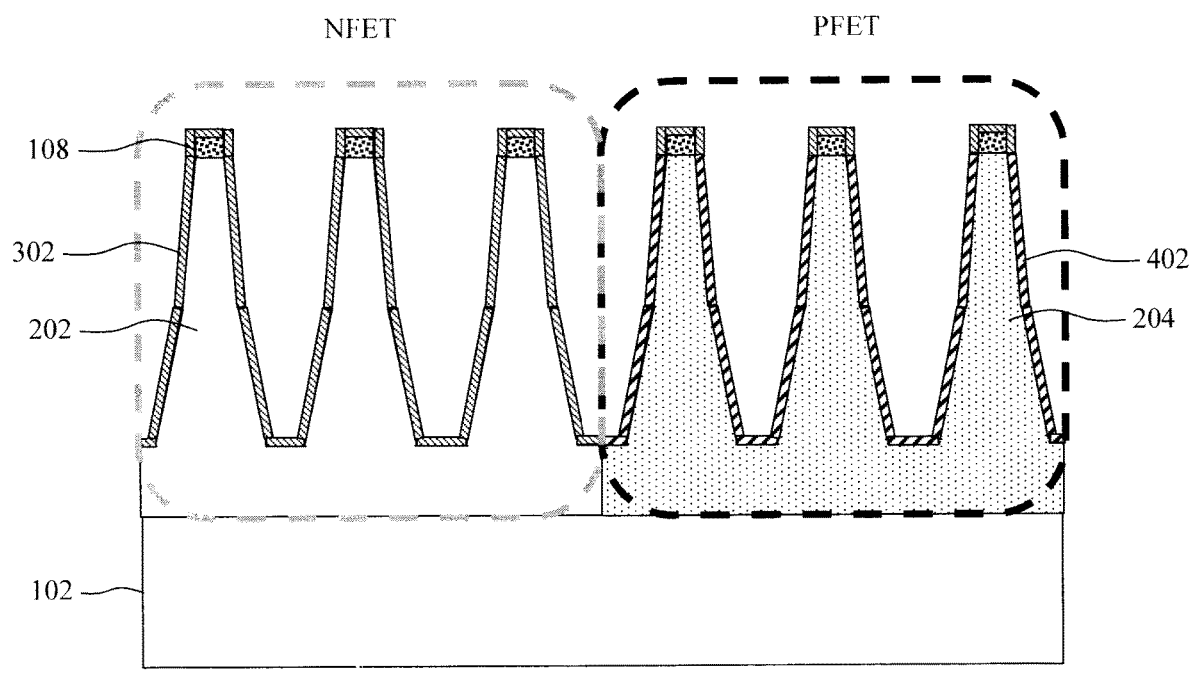
FIG. 4 is a cross-sectional diagram illustrating a low-temperature anneal of the fins having been performed to selectively oxidize the Si in the SiGe PFET fins to form a (first) oxide layer on the SiGe PFET fins according to an embodiment of the present invention.

Namely, a low-temperature anneal of the fins is then performed to selectively oxidize the Si in the SiGe PFET fins 204 to form a conformal oxide layer 402 (e.g., SiO$_2$) on the SiGe PFET fins 204. See FIG. 4. According to an exemplary embodiment, the anneal is performed at a temperature of from about 500° C. to about 700° C. and ranges therebetween, e.g., about 600° C. Preferably, the anneal is performed in the presence of an inert gas such as hydrogen and/or nitrogen. As shown in FIG. 4, the reaction only occurs where the GeO$_2$ layer 302 is in contact with the SiGe PFET fins. For instance, the GeO$_2$ layer 302 deposited onto the fin hardmasks 108 remains unreacted, as does the GeO$_2$ layer 302 deposited onto the Si NFET fins 202.

Figure 5:
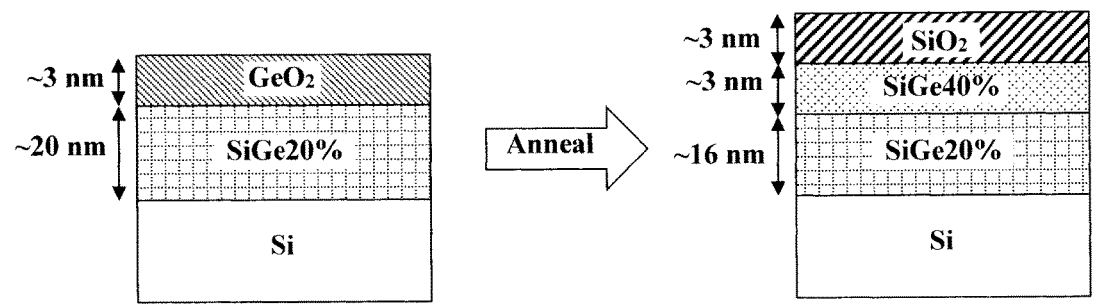
FIG. 5 is a diagram illustrating the reaction used to selectively form the first oxide layer on the PFET fins according to an embodiment of the present invention.
Figure 6:
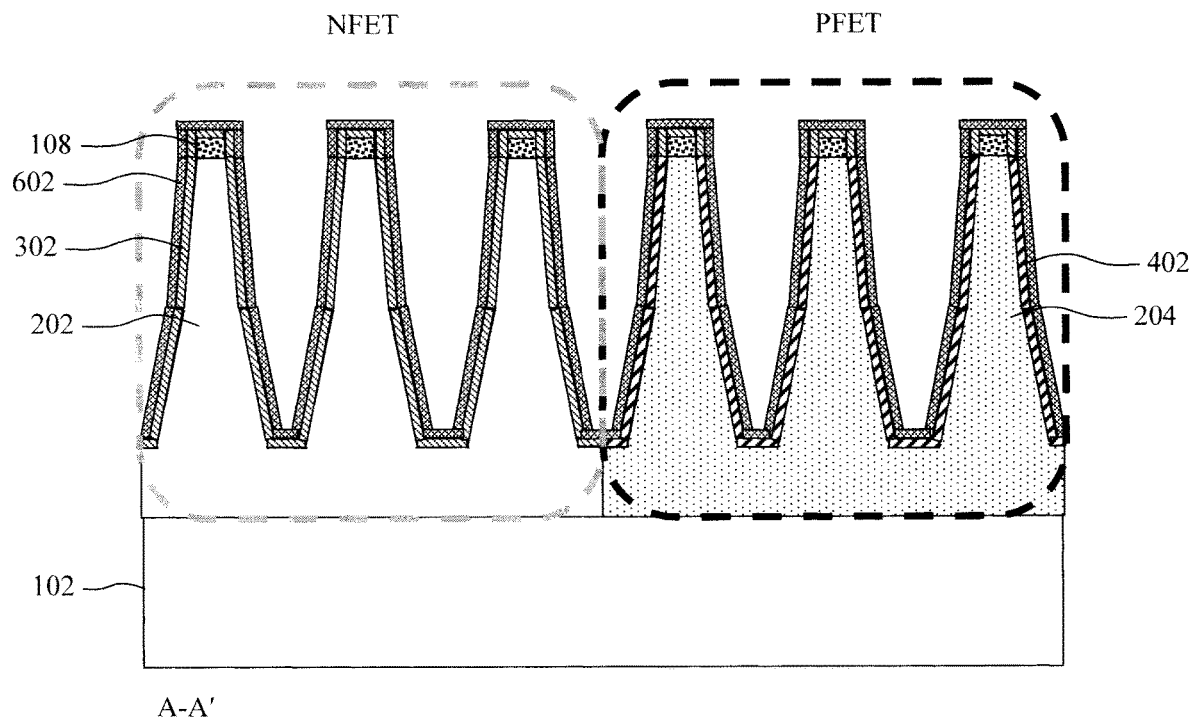
FIG. 6 is a cross-sectional diagram illustrating a liner having been deposited over the (unreacted) $GeO_2$ layer on the NFET fins and over the first oxide layer on the PFET fins according to an embodiment of the present invention.

The reaction used to selectively form oxide layer 402 in the PFET fins 204 is detailed in FIG. 5. As shown in FIG. 5, when GeO$_2$ (such as GeO$_2$ layer 302) is deposited directly onto a SiGe structure (such as SiGe PFET fins 204), and an anneal is performed, Si in the SiGe structure is oxidized to form SiO$_2$ over a condensed SiGe layer. Namely, as shown in FIG. 5, the starting SiGe in this example has about 20% atomic weight Ge (SiGe20%). Oxidation of the Si atoms condenses the Ge in the top portion of the SiGe layer, forming a higher concentration SiGe layer having about 40% atomic weight Ge (SiGe40%) on top of the SiGe20%.

The oxidation reaction is detailed as follows:

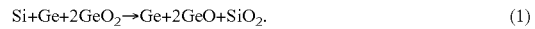

$$Si+Ge+2GeO_2 \rightarrow Ge+2GeO+SiO_2. \quad (1)$$

Looking at the right side of the Equation 1, Ge is what remains as, for example, the condensed Ge layer SiGe40% on top of the SiGe20%. The 2GeO is a volatile species, and the SiO$_2$ is the oxide formed on the SiGe PFET fins 204. As highlighted above, GeO$_2$ layer 302 is deposited onto both the Si NFET fins 202 and the SiGe PFET fins 204. However, the oxidation reaction (see Equation 1) occurs only at the SiGe PFET fins 204. The GeO$_2$ layer 302 on the Si NFET fins 202 remains unreacted. The reason for this selectivity is that the Si in the SiGe PFET fins 204 has a lower Gibbs free energy as compared to the Ge in SiGe but Si does not react with GeO$_2$ NFET fins 202 (due to strong Si—Si bonding).

A conformal liner 602 is next deposited onto the NFET/PFET fins 202/204, i.e., over the (unreacted) GeO$_2$ layer 302 on the NFET fins 202 and over the oxide layer 402 on the PFET fins 204. Ultimately, the liner 602 will be removed from the NFET fins 202 and remain protecting the PFET fins 204. Suitable liner materials include, but are not limited to, dielectric materials such as SiN, yttrium oxide (Y$_2$O$_3$), lutetium oxide (Lu$_2$O$_3$), lanthanum oxide (La$_2$O$_3$), strontium oxide (SrO), titanium nitride (TiN) and/or tantalum nitride (TaN). By way of example only, the liner 602 can be deposited onto the NFET/PFET fins 202/204 using a process such as PVD, CVD or ALD. According to an exemplary embodiment, the liner 602 has a thickness of from about 3 nanometers (nm) to about 6 nm and ranges therebetween, e.g., about 5 nm. Notably, the liner 602 is present on unreacted GeO$_2$ layer 302 over the NFET fins 202 and a small portion of unreacted GeO$_2$ layer 302 on the fin hardmasks 108 over the PFET fins 204.

As provided above, the formation of a dipole layer at the fin/STI interface reduces source-drain off state leakage current. Preferably, a positive dipole layer is formed at the PFET fins 204 and a negative dipole layer is formed at the NFET fins 202. In this case, liner 602, e.g., SiN, Y$_2$O$_3$, Lu$_2$O$_3$, La$_2$O$_3$, SrO, TiN and/or TaN, (i.e., the positive dipole layer) has a positive polarity which induces a negative charge in the SiGe PFET fins 204. As will be described in detail below, steps will be performed later in the process to form a dielectric layer, e.g., aluminum oxide (Al$_2$O$_3$), titanium oxide (TiO$_2$), zirconium oxide (ZrO$_2$), hafnium oxide (HfO$_2$) and/or magnesium oxide (MgO), (i.e., the negative dipole layer) having a negative polarity on the Si NFET fins 202 which induces a positive charge in the Si NFET fins 202.

Figure 7:
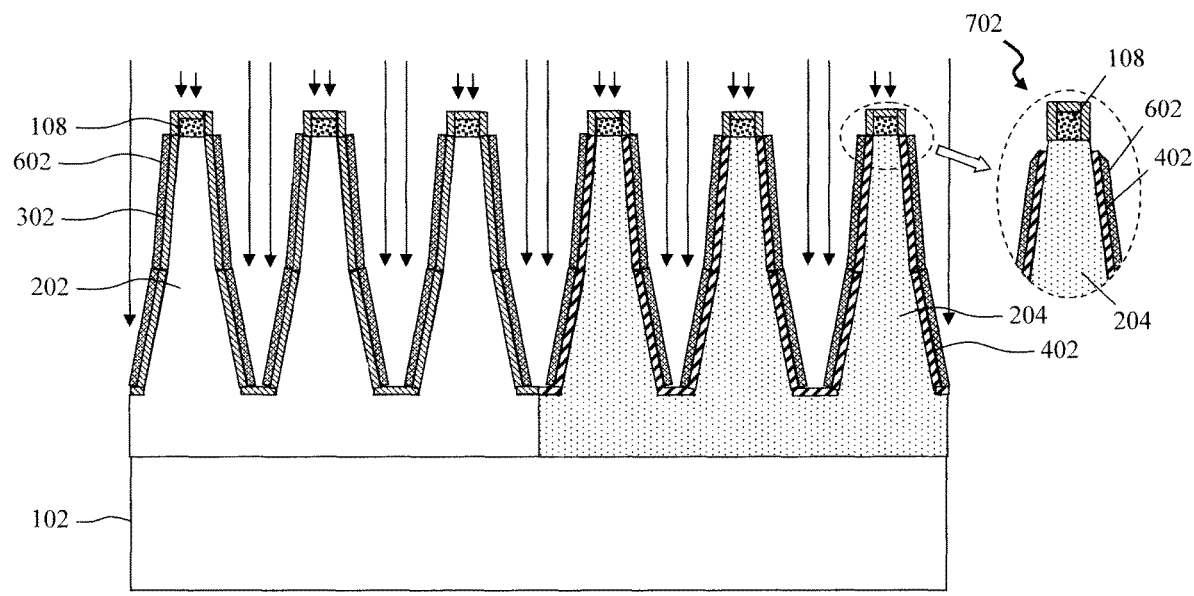
FIG. 7 is a cross-sectional diagram illustrating the liner having been etched back at the tops of the NFET/PFET fins according to an embodiment of the present invention.

As will be described in detail below, a lift-off process will be used to remove the unreacted GeO$_2$ layer 302 and the liner 602 from the NFET fins 202. In order to do so, the unreacted GeO$_2$ layer 302 is next exposed at the tops of the NFET/PFET fins 202/204. Namely, as shown in FIG. 7, a directional (anisotropic) etching process, such as a nitride-selective RIE, is used to etch back the liner 602 at the tops of the NFET/PFET fins 202/204. As shown in FIG. 7, this etch also removes the liner 602 from horizontal surfaces in between the fins 202/204. The unreacted $GeO_2$ layer 302 is now exposed at the tops of the NFET fins 202 (as is the unreacted $GeO_2$ layer 302 over the fin hardmasks 108 of the PFET fins 204).

As shown in magnified view 702, the directionality of the etch produces outwardly sloping sidewalls at the tops of the NFET/PFET fins 202/204. Naturally, the etch progresses from the outer exposed surfaces of the liner 602 inward, with a greater amount of material being removed from the more outwardly surfaces. Hence, the sloped profile is produced in liner 602.

Figure 8:
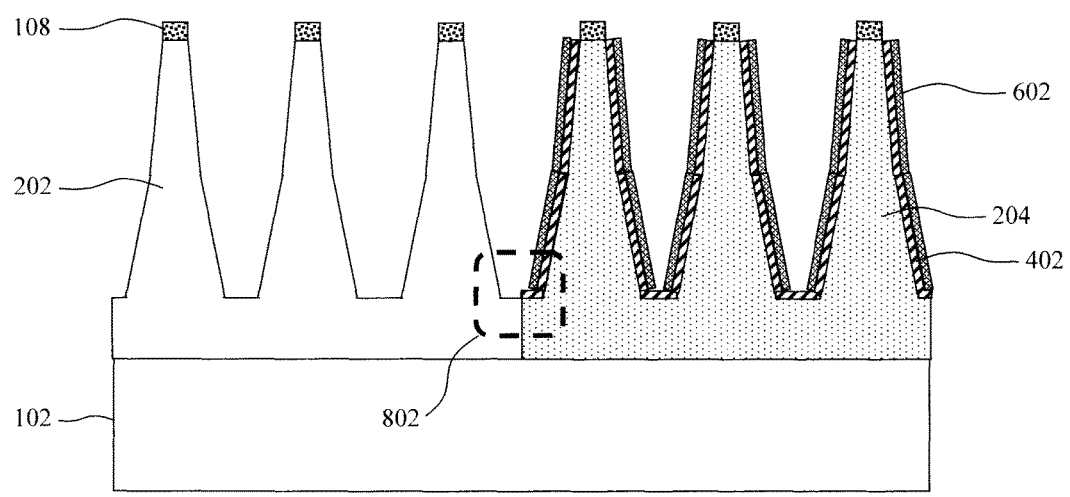
FIG. 8 is a cross-sectional diagram illustrating a lift-off process having been used to remove the unreacted $GeO_2$ layer, and with it the liner from the NFET fins according to an embodiment of the present invention.

A lift-off process is then used to remove the unreacted $GeO_2$ layer 302, and with it the liner 602 from the NFET fins 202. See FIG. 8. By contrast, as shown in FIG. 8, the absence of unreacted $GeO_2$ on the PFET fins 204 (except the small portion on the fin hardmasks 108) prevents the same lift-off from occurring in the PFET fins 204. Namely, the above-described oxidation reaction produced oxide layer 402 (e.g., $SiO_2$) on the SiGe PFET fins 204 beneath the liner 602. This oxide layer 402 is unaffected by the lift-off process, and thus the liner 602 remains intact over the PFET fins 402. The liner 602 will protect/cover the PFET while selective processing of the NFET fins 202 is performed (see below).

According to an exemplary embodiment, the lift-off is performed using deionized (DI) water. Namely, DI water is used to wash out the unreacted $GeO_2$ on the NFET fins 202 and thereby lift-off the liner 602 from the NFET fins 202. As a result, a unique structure is obtained. For instance, as shown in FIG. 8, the interface between the NFET fins 202 and the PFET fins 204 (see highlighted area 802) includes an abrupt shift between the oxide layer 402/liner 602 being on the PFET fins 204, while the adjacent NFET fins 202 are bare. As provided above, the liner 602 will prevent (SiGe) PFET fin loss due to oxidation during the STI thermal anneal (see FIG. 10, described below). Further, as will become apparent from the following description, the placement of the liner 602 on the PFET fins 204 permits the selective processing of the NFET fins 202 without further masking.

A conformal oxide layer 902 is then formed on the exposed surfaces of the NFET fins 202. See FIG. 9. According to an exemplary embodiment, oxide layer 902 is formed by exposing the NFET fins 202 to an oxygen-containing ambient, thereby forming a native oxide on the NFET fins 202. Liner 602 is present over/covering the PFET fins 204. Thus, no oxidation will occur on the PFET fins 204. As provided above, the NFET fins 202 can be formed from Si. In that case, the native oxide layer 902 will be $SiO_2$. Like native oxide layer 902, oxide layer 402 can also be formed from $SiO_2$. See above. Accordingly, the same patterning is used in the figures to represent both oxide layers 402/902. For clarity, the designations first/second may be used to reference the oxide layers 402/902, respectively.

Figure 9:
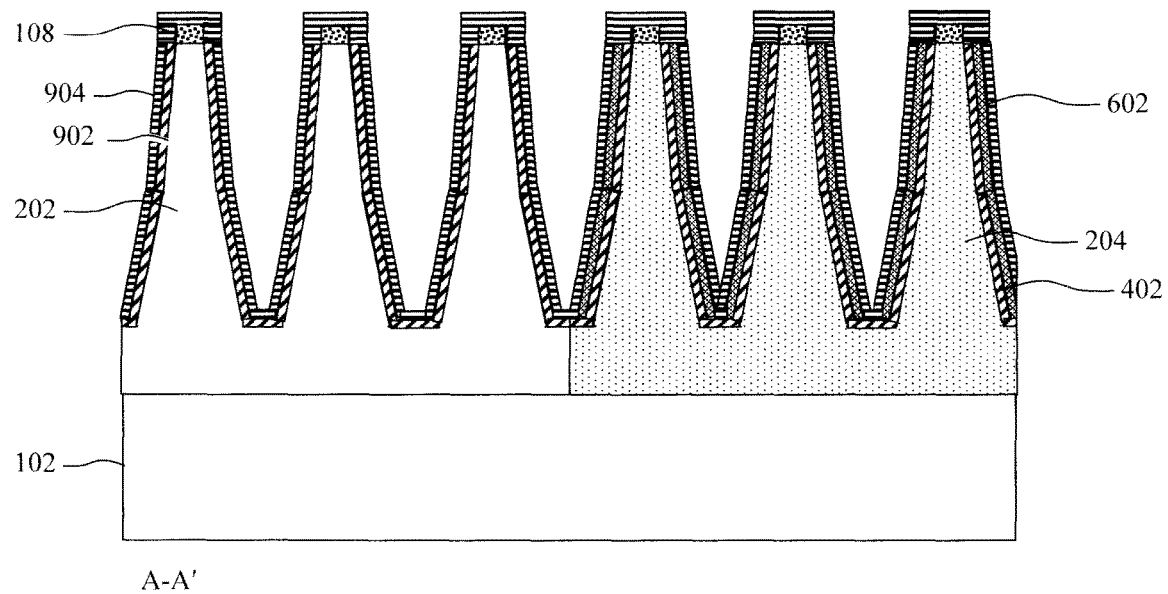
FIG. 9 is a cross-sectional diagram illustrating a (second) oxide layer having been formed on the exposed surfaces of the NFET fins and on the PFET fins over the liner according to an embodiment of the present invention.

It is notable that, based on the selective lift-off process (as shown in FIG. 8) to expose only the NFET fins 202 and selective oxidation of the exposed NFET fins 202 (as shown in FIG. 9), additional masking steps advantageously are not needed in the present process flow. This is what is meant by a maskless process. Namely, without selective exposure of the NFET fins 202 for oxidation, blanket deposition of an oxide (on both NFET and PFET fins) would be performed, followed by an additional step to mask the NFET fins in order to remove the oxide from the PFET fins, all of which increase production complexity, production time and overall costs.

As provided above, the formation of a dipole layer at the fin/STI interface reduces source-drain off state leakage current. Preferably, a positive dipole layer is formed at the PFET fins 204 and a negative dipole layer is formed at the NFET fins 202. To form the negative dipole layer on the NFET fins 202, a dielectric layer 904 having a negative polarity is deposited onto the NFET fins 202 directly onto the oxide layer 902 which induces a positive charge in the Si NFET fins 202. Suitable dielectrics for layer 904 include, but are not limited to, $Al_2O_3$, $TiO_2$, $ZrO_2$, $HfO_2$ and/or MgO. According to an exemplary embodiment, the dielectric for layer 904 is deposited using a conformal deposition process such as PVD, CVD or ALD to a thickness of from about 1 nm to about 5 nm and ranges therebetween. As shown in FIG. 9, a blanket deposition of the dielectric layer 904 onto both the NFET and PFET fins 202 and 204 can be performed. However, since the dielectric layer 904 will be deposited onto the PFET fins 204 over the liner 602, the polarity of dielectric layer 904 will have no effect on the dipole at the PFET fin 204/STI interface.

Figure 10:
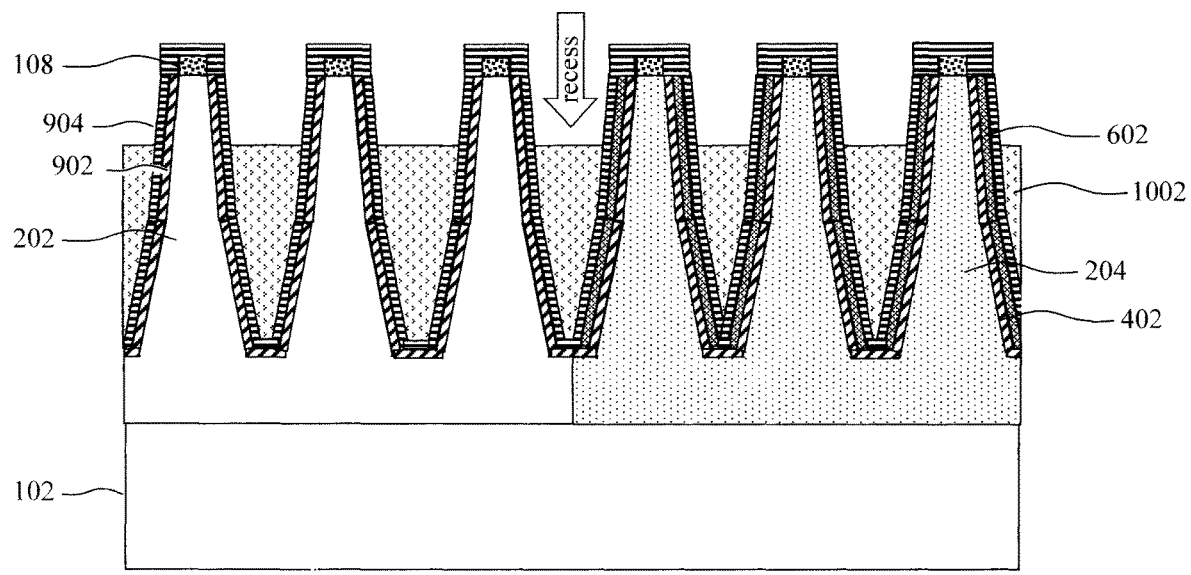
FIG. 10 is a cross-sectional diagram illustrating the fins having been buried in an oxide that is then recessed below the tops of the fins according to an embodiment of the present invention.

The fins 202/204 are then buried in an oxide 1002 followed by a STI thermal anneal and then, as shown in FIG. 10, the oxide 1002 is recessed below the tops of the fins 202/204. By way of example only, the as-deposited oxide 1002 is first polished down to the dielectric layer 904 over the fin hardmasks 108. A recess etch such as an oxide-selective wet etch is then used to recess the oxide 1002 below the tops of the fins 202/204. The oxide 1002, as deposited, is then planarized using a process such as chemical-mechanical polishing (CMP) down to the tops of the fins 202/204. Suitable oxides 1002 include, but are not limited to, flowable oxides such as a hydrogen silsesquioxane (HSQ) solution in methyl isobutyl ketone (MIBK) which can be deposited onto the fins 202/204 using a casting process such as spin coating, spray coating, etc. According to an exemplary embodiment, the STI thermal anneal is performed at a temperature of from about 800° C. to about 1000° C. and ranges therebetween.

Figure 11:
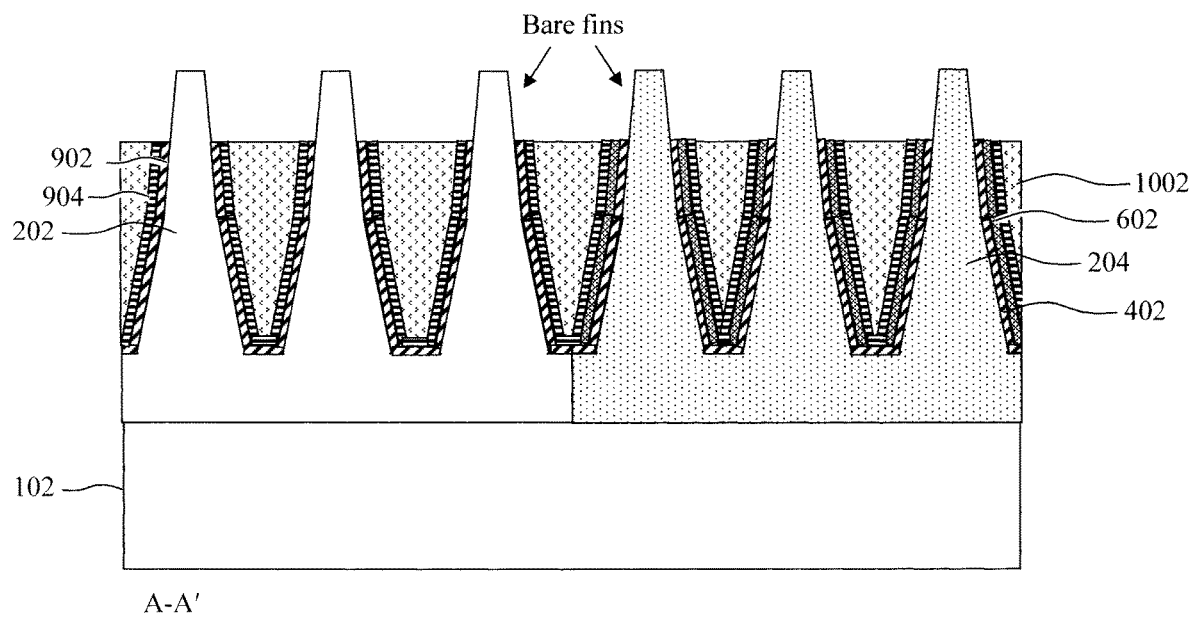
FIG. 11 is a cross-sectional diagram illustrating the fin hardmasks, second oxide layer and dielectric layer above the oxide having been removed from the NFET fins, and the fin hardmasks, first oxide layer, liner and dielectric layer above the oxide having been removed from the PFET fins according to an embodiment of the present invention.

The recess depth sets the fin channel height above the oxide 1002. Namely, as shown in FIG. 11, the fin hardmasks 108 and various other layers over the fins 202/204 above the oxide 1002 are removed. Specifically, as shown in FIG. 11, fin hardmasks 108, oxide layer 902 and dielectric layer 904 above the oxide 1002 are removed from the NFET fins 202. Likewise, fin hardmasks 108, oxide layer 402, liner 602 and dielectric layer 904 above the oxide 1002 are removed from the PFET fins 204. By way of example only, a series of wet and/or dry etching steps may be employed to recess these layers down to the oxide 1002. What remains above the oxide are the bare Si/SiGe NFET/PFET fins 202/204. It is over these bare fin channels that gates of the respective NFET and PFET devices will be formed. See below.

Figure 12A:
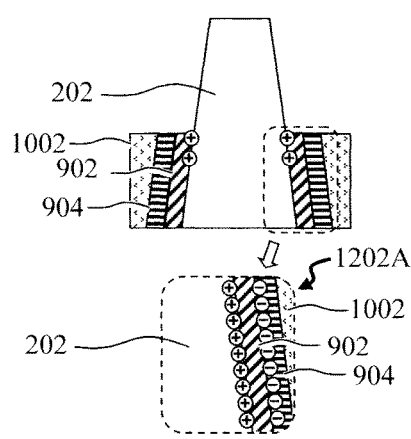
FIG. 12A is a cross-sectional diagram illustrating the negative dipole layer formed at the NFET fins according to an embodiment of the present invention.
Figure 12B:
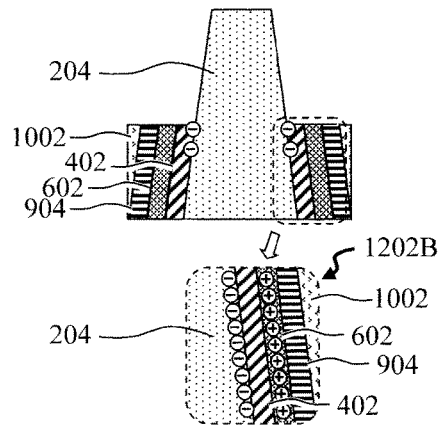
FIG. 12B is a cross-sectional diagram illustrating the positive dipole layer formed at the PFET fins according to an embodiment of the present invention.

The negative dipole layer formed at the NFET fins 202 and the positive dipole layer formed at the PFET fins 204 are further illustrated in FIGS. 12A and 12B, respectively. Namely, as shown in FIG. 12A, dielectric layer 904, e.g., $Al_2O_3$, $TiO_2$, $ZrO_2$, $HfO_2$ and/or MgO (which has a negative polarity) induces a positive charge in the Si NFET fins 202. This concept is further illustrated in magnified view 1202A which shows the positive charge induced in the NFET fins 202 based on the negative polarity of the dielectric layer 904 adjacent to a side of oxide layer 902 opposite the fins 202.

Similarly, as shown in FIG. 12B, liner 602, e.g., SiN, $Y_2O_3$, $Lu_2O_3$, $La_2O_3$, SrO, TiN and/or TaN (which has a positive polarity) induces a negative charge in the SiGe PFET fins 204. This concept is further illustrated in magnified view 1202B which shows the negative charge induced in the PFET fins 204 based on the positive polarity of the liner 602 adjacent to a side of oxide layer 402 opposite the fins 204.

To complete the device, gates are formed over the NFET/PFET fin channels and source and drains are formed on opposite sides of the gates, offset from the gates by gate spacers. In the present example, a gate-last process is employed. In a gate last process, a sacrificial dummy gate is placed over the NFET/PFET channel and acts as a placeholder for the final device gate, oftentimes a metal gate. Metal gates employ high-κ gate dielectrics that are particularly sensitive to the conditions (such as elevated temperatures) employed during formation of device structures such as the source and drain. Thus, placing a dummy gate enables the source and drain to be formed without consequence to the final gate structure. Afterwards, near the end of the process, the dummy gate is removed and replaced with a 'replacement' final gate.

Referring now to cross-sectional views B-B' (see FIG. 2A) which depict a cut parallel to the fins 202/204, through fins 202/204, a plurality of dummy gates 1302 are formed over the NFET/PFET fins 202/204. See FIG. 13. Dummy gates 1302 can be formed by first blanket depositing a suitable dummy gate material and then using standard lithography and etching techniques to pattern the dummy gate material into the individual dummy gates 1302 shown in FIG. 13. Suitable dummy gate materials include, but are not limited to, poly-silicon (poly-Si) and amorphous silicon (a-Si).

Figure 13:
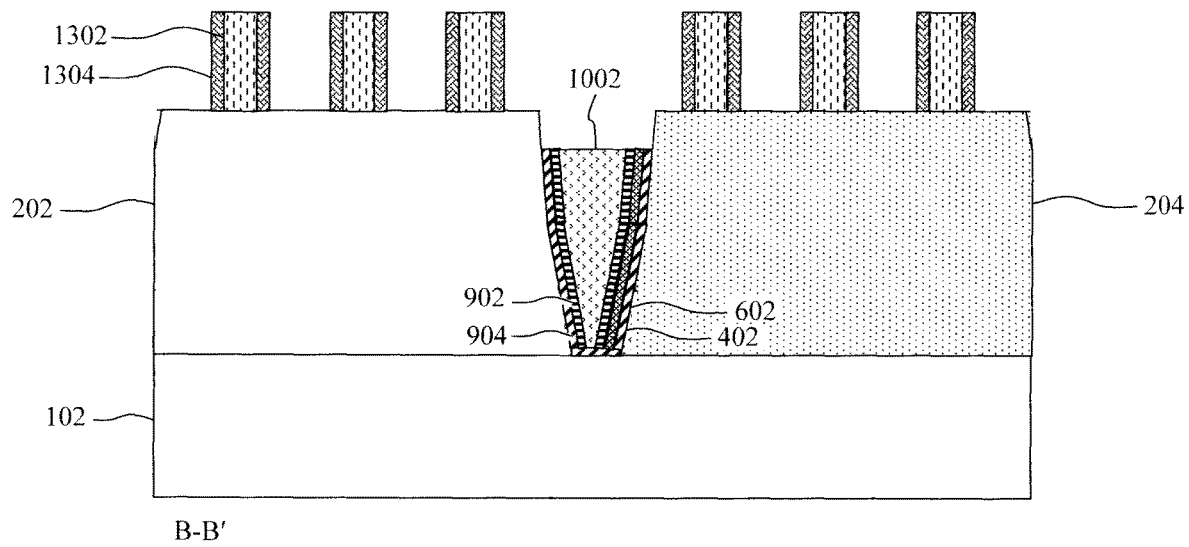
FIG. 13 is a cross-sectional diagram illustrating a plurality of dummy gates having been formed over the NFET/PFET fins, and gate spacers having been formed alongside the dummy gates according to an embodiment of the present invention.
Figure 14:
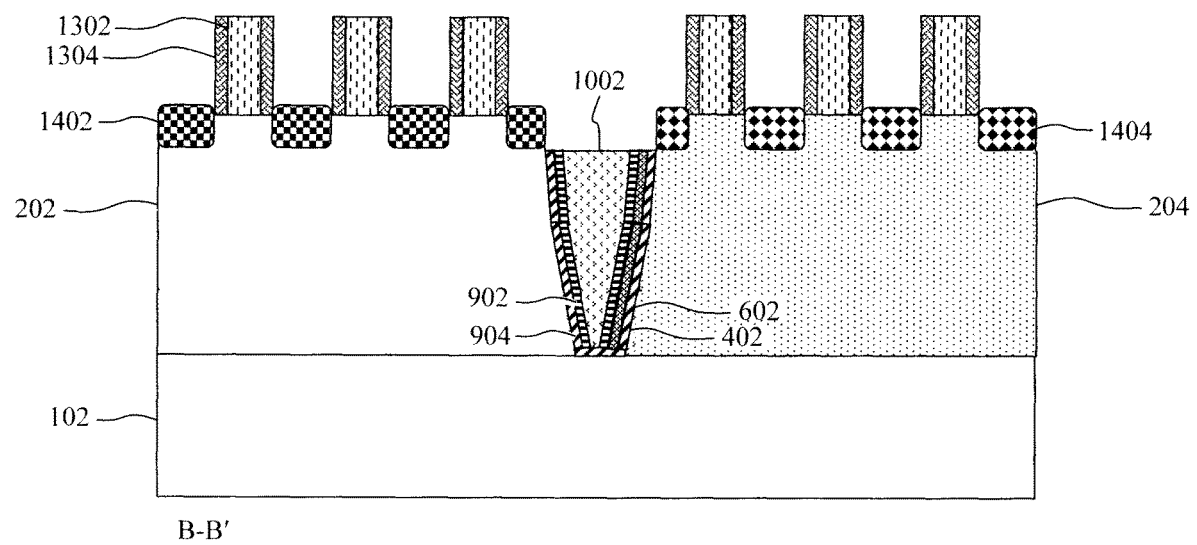
FIG. 14 is a cross-sectional diagram illustrating NFET/PFET source and drains having been formed on opposite sides of the dummy gates according to an embodiment of the present invention.
Figure 15:
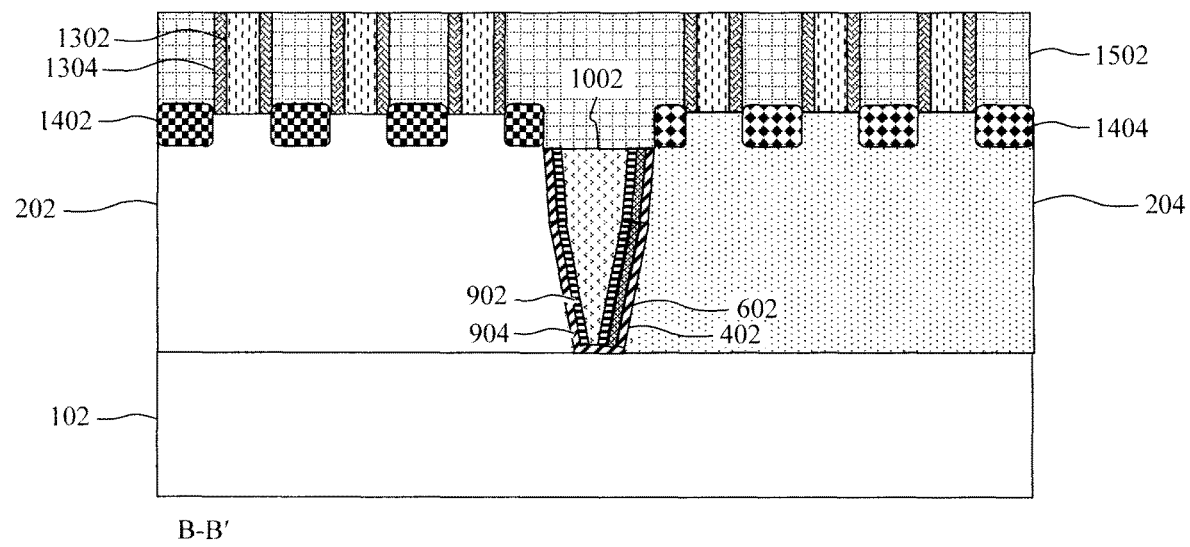
FIG. 15 is a cross-sectional diagram illustrating a dielectric fill material having been deposited surrounding the dummy gates according to an embodiment of the present invention.
Figure 16:
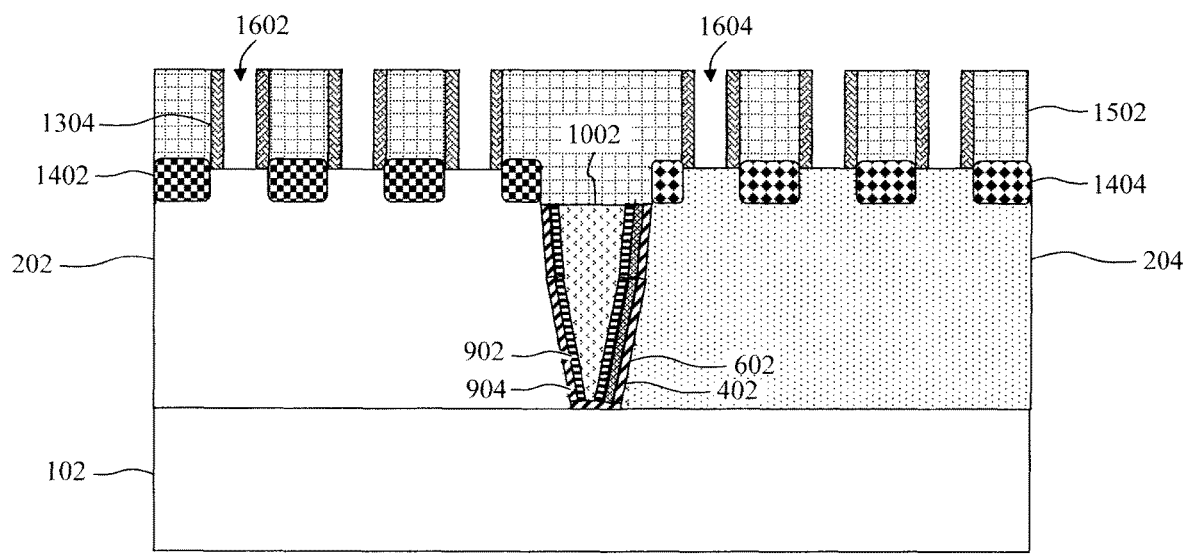
FIG. 16 is a cross-sectional diagram illustrating the dummy gates having been removed forming gate trenches in the dielectric fill material according to an embodiment of the present invention.
Figure 17:
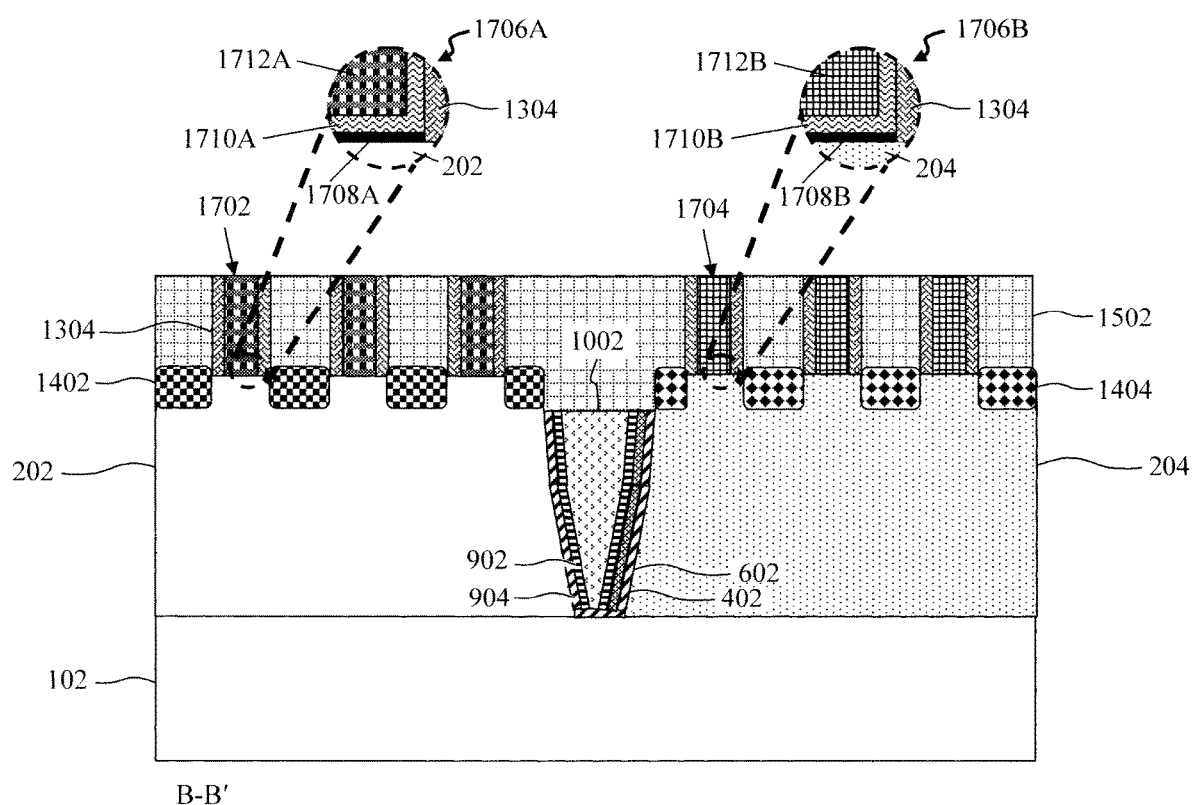
FIG. 17 is a cross-sectional diagram illustrating replacement gates having been formed in the NFET and PFET gate trenches according to an embodiment of the present invention.

Gate spacers 1304 are next formed alongside the dummy gates 1302. Gate spacers 1304 can be formed by blanket depositing a suitable spacer material onto the dummy gates 1302, and then using a directional (anisotropic) etch such as RIE to pattern the spacer material into the gate spacers 1304 shown in FIG. 13. Suitable spacer materials include, but are not limited to, oxide spacer materials such as silicon dioxide ($SiO_2$) and/or silicon oxycarbide (SiOC) and/or nitride spacer materials such as SiN, silicon-boron-nitride (SiBN) and/or silicon borocarbonitride (SiBCN). As shown in FIG. 13, at least one dummy gate 1302 (and associated gate spacers 1304) is formed over each of the NFET and PFET fins 202/204.

NFET/PFET source and drains 1402/1404 are then formed on opposite sides of the dummy gates 1302 on the NFET/PFET fins 202/204, respectively. See FIG. 14. Advantageously, the use of dummy gates at this stage in the process prevents elevated temperatures employed during source drain formation from causing any performance degradation. For instance, subjecting high-κ gate dielectrics (that may be used in the replacements gate—see below) to high thermal stress can cause these materials to breakdown, thereby degrading device performance.

According to an exemplary embodiment, an epitaxial process is used to grow the source and drains 1402/1404 on the NFET/PFET fins 202/204, respectively. For instance, the source and drains 1402/1404 are formed from an in-situ doped (dopants introduced during growth) or ex-situ doped (dopants introduced by a process such as ion implantation) epitaxial material. As provided above, suitable n-type dopants include, but are not limited to, P and/or As, and suitable p-type dopants include, but are not limited to, B. By way of example only, according to an exemplary embodiment, the NFET source and drains 1402 are formed from epitaxial phosphorous-doped Si (Si:P) and the PFET source and drains 1404 are formed from epitaxial boron-doped SiGe (SiGe:B).

In order to enable selective removal of the dummy gates 1302, a dielectric fill material 1502 is deposited surrounding the dummy gates 1302. Suitable dielectric fill materials include, but are not limited to, $SiO_2$. As deposited, the dielectric fill material 1502 is then polished down to the tops of the dummy gates 1302. See FIG. 15. A polishing process such as CMP can be employed.

CMP of the dielectric fill material 1502 exposes the tops of the dummy gates 1302. A selective etching process (such as a poly-Si or a-Si-selective RIE) is then employed to remove the dummy gates 1302, forming NFET/PFET gate trenches 1602/1604 in the dielectric fill material 1502 between the gate spacers 1304 over the NFET/PFET fins 202/204, respectively. See FIG. 16.

Replacement gates 1702 and 1704 are then formed in the NFET and PFET gate trenches 1602 and 1604, respectively. See FIG. 17. As shown in magnified views (NFET) 1706A and (PFET) 1706B, replacement gates 1702 and 1704 each includes an interfacial oxide 1708A and 1708B on exposed surfaces of the fins 202 and 204, respectively, a gate dielectric 1710A and 1710B disposed over the interfacial oxide 1708A and 1708B, and a gate conductor 1712A and 1712B disposed on the gate dielectric 1710A and 1710B, respectively. Interfacial oxide 1708A and 1708B can be formed by an oxidation process. According to an exemplary embodiment, interfacial oxide 1708A and 1708B is formed having a thickness of from about 0.3 nm to about 5 nm and ranges therebetween, e.g., about 1 nm.

Suitable gate dielectrics 1710A and 1710B include, but are not limited to, silicon oxide (SiOx), SiN, silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as hafnium oxide ($HfO_2$), hafnium silicon oxide (HfSiOx), hafnium silicon oxynitride (HfSiOx), $La_2O_3$, lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiOx), barium strontium titanium oxide ($BaO_6SrTi_2$), barium titanium oxide ($BaTiO_3$), strontium titanium oxide ($SrTiO_3$), $Y_2O_3$, aluminum oxide ($Al_2O_3$), lead scandium tantalum oxide ($Pb(Sc,Ta)O_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, gate dielectrics 1710A and 1710B each have a thickness of from about 1 nm to about 5 nm and ranges therebetween, although less thicknesses and greater thicknesses are also conceived.

Suitable gate conductors 1712A and 1712B include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. According to an exemplary embodiment, gate conductors 1712A and 1712B each have a thickness of from about 5 nm to about 20 nm and ranges therebetween, although less thicknesses and greater thicknesses are also conceived.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a dual channel fin field-effect transistor (finFET) device, comprising the steps of:
    patterning fins on a wafer, wherein the fins comprise at least one n-channel FET (NFET) fin formed from a first channel material and at least one p-channel FET (PFET) fin formed from a second channel material comprising germanium (Ge), and wherein the first channel material and the second channel material comprise dual channels of the finFET device;
    depositing a germanium oxide (GeO$_2$) layer on the fins;
    annealing the fins to selectively oxidize the at least one PFET fin based on a reaction of the GeO$_2$ layer with the second channel material thereby forming a first oxide layer on the at least one PFET fin while unreacted GeO$_2$ remains on the at least one NFET fin;
    depositing a liner onto the fins, wherein the liner has a positive polarity which induces a negative charge in the at least one PFET fin;
    removing the unreacted GeO$_2$ along with the liner from the at least one NFET fin;
    forming a second oxide layer on the at least one NFET fin; and
    depositing a dielectric layer onto the fins, wherein the dielectric layer has a negative polarity which induces a positive charge in the at least one NFET fin.

2. The method of claim 1, further comprising the steps of:
    forming gates over the fins; and
    forming source and drains on opposite sides of the gates, offset from the gates by gate spacers.

3. The method of claim 2, further comprising the steps of:
    forming dummy gates over the at least one NFET fin and over the at least one PFET fin;
    forming the gate spacers alongside the dummy gates;
    forming the source and drains on opposite sides of the dummy gates, offset from the dummy gates by the gate spacers;
    surrounding the dummy gates with a dielectric fill material;
    removing the dummy gates forming gate trenches over of the at least one NFET fin and over the at least one PFET fin; and
    forming replacement gates in the gate trenches.

4. The method of claim 1, wherein the first channel material comprises silicon (Si) and the second channel material comprises silicon germanium (SiGe).

5. The method of claim 4, wherein the second channel material comprises SiGe having from about 20% atomic weight Ge about 25% atomic weight Ge and ranges therebetween.

6. The method of claim 1, further comprising the steps of:
    growing the first channel material on a first portion of the wafer;
    growing the second channel material on a second portion of the wafer;
    forming fin hardmasks on the first channel material and on the second channel material; and
    patterning the at least one NFET fin in the first channel material and the at least one PFET fin in the second channel material using the fin hardmasks.

7. The method of claim 1, wherein the first channel material comprises an n-type dopant, and wherein the second channel material comprises a p-type dopant.

8. The method of claim 1, wherein the GeO$_2$ layer has a thickness of from about 2 nm to about 10 nm and ranges therebetween.

9. The method of claim 1, wherein the annealing is performed at a temperature of from about 500° C. to about 700° C. and ranges therebetween.

10. The method of claim 1, wherein the liner comprises a material selected from the group consisting of: silicon nitride (SiN), yttrium oxide (Y$_2$O$_3$), lutetium oxide (Lu$_2$O$_3$), lanthanum oxide (La$_2$O$_3$), strontium oxide (SrO), titanium nitride (TiN), tantalum nitride (TaN) and combinations thereof.

11. The method of claim 1, wherein the unreacted GeO$_2$ is removed using deionized (DI) water.

12. The method of claim 1, wherein the step of forming the second oxide layer on the at least one NFET fin comprises the step of:
    exposing the at least one NFET fin to an oxygen-containing ambient, thereby forming a native oxide on the at least one NFET fin.

13. The method of claim 1, wherein the dielectric layer comprises a material selected from the group consisting of: aluminum oxide (Al$_2$O$_3$), titanium oxide (TiO$_2$), zirconium oxide (ZrO$_2$), hafnium oxide (HfO$_2$), magnesium oxide (MgO) and combinations thereof.

14. A method for forming a dual channel finFET device, comprising the steps of:
    patterning fins on a wafer, wherein the fins comprise at least one NFET fin formed from a first channel material and at least one PFET fin formed from a second channel material comprising Ge, and wherein the first channel material and the second channel material comprise dual channels of the finFET device;

depositing a GeO$_2$ layer on the fins;

annealing the fins to selectively oxidize the at least one PFET fin based on a reaction of the GeO$_2$ layer with the second channel material thereby forming a first oxide layer on the at least one PFET fin while unreacted GeO$_2$ remains on the at least one NFET fin;

depositing a liner onto the fins, wherein the liner has a positive polarity which induces a negative charge in the at least one PFET fin;

removing the unreacted GeO$_2$ along with the liner from the at least one NFET fin;

forming a second oxide layer on the at least one NFET fin;

depositing a dielectric layer onto the fins, wherein the dielectric layer has a negative polarity which induces a positive charge in the at least one NFET fin;

forming dummy gates over the at least one NFET fin and over the at least one PFET fin;

forming the gate spacers alongside the dummy gates;

forming the source and drains on opposite sides of the dummy gates, offset from the dummy gates by the gate spacers;

surrounding the dummy gates with a dielectric fill material;

removing the dummy gates forming gate trenches over of the at least one NFET fin and over the at least one PFET fin; and forming replacement gates in the gate trenches.

15. The method of claim 14, wherein the first channel material comprises Si and the second channel material comprises SiGe.

16. The method of claim 15, wherein the second channel material comprises SiGe having from about 20% atomic weight Ge about 25% atomic weight Ge and ranges therebetween.

17. The method of claim 14, wherein the liner comprises a material selected from the group consisting of: SiN, Y$_2$O$_3$, Lu$_2$O$_3$, La$_2$O$_3$, SrO, TiN, TaN and combinations thereof.

18. The method of claim 14, wherein the dielectric layer comprises a material selected from the group consisting of: Al$_2$O$_3$, TiO$_2$, ZrO$_2$, HfO$_2$, MgO and combinations thereof.

19. A dual channel finFET device, comprising:

fins patterned on a wafer, wherein the fins comprise at least one NFET fin formed from a first channel material and at least one PFET fin formed from a second channel material comprising Ge, and wherein the first channel material and the second channel material comprise dual channels of the finFET device;

a first oxide layer on the at least one PFET fin;

a liner disposed on the at least one PFET fin, wherein the liner has a positive polarity which induces a negative charge in the at least one PFET fin, and wherein the liner comprises a material selected from the group consisting of: SiN, Y$_2$O$_3$, Lu$_2$O$_3$, La$_2$O$_3$, SrO, TiN, TaN and combinations thereof;

a second oxide layer on the at least one NFET fin;

a dielectric layer disposed on both the at least one NFET fin and the at least one PFET fin, wherein the dielectric layer has a negative polarity which induces a positive charge in the at least one NFET fin, and wherein the dielectric layer comprises a material selected from the group consisting of: Al$_2$O$_3$, TiO$_2$, ZrO$_2$, HfO$_2$, MgO and combinations thereof;

gates disposed over the fins; and source and drains formed on opposite sides of the gates, offset from the gates by gate spacers.

20. The dual channel finFET device of claim 19, wherein the first channel material comprises Si and the second channel material comprises SiGe.

* * * * *